(12) United States Patent
Gideon (10) Patent No.: US 8,937,492 B1
(45) Date of Patent: Jan. 20, 2015

(54) SYSTEMS AND METHODS FOR TRANSFERRING A SIGNAL FROM A FIRST CLOCK DOMAIN TO A SECOND CLOCK DOMAIN

(71) Applicant: Marvell Israel (M.I.S.L) Ltd., Yokneam (IL)

(72) Inventor: Paul Gideon, Modiin (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 14/060,856

(22) Filed: Oct. 23, 2013

Related U.S. Application Data

(60) Provisional application No. 61/717,918, filed on Oct. 24, 2012.

(51) Int. Cl.
*H03K 19/00* (2006.01)
*H03K 19/003* (2006.01)

(52) U.S. Cl.
CPC .................................... *H03K 19/003* (2013.01)
USPC .................................. 326/94; 326/93; 326/96

(58) Field of Classification Search
USPC ............................................... 326/46, 93–98
See application file for complete search history.

(56) References Cited

U.S. PATENT DOCUMENTS

| 5,548,620 | A | 8/1996 | Rogers | |
|---|---|---|---|---|
| 2004/0250151 | A1* | 12/2004 | Abendroth et al. | 713/400 |
| 2007/0177698 | A1* | 8/2007 | Pawar | 375/354 |
| 2011/0199121 | A1* | 8/2011 | Yang et al. | 326/94 |
| 2012/0038398 | A1* | 2/2012 | Singhal et al. | 327/153 |
| 2012/0303996 | A1* | 11/2012 | Bauernfeind | 713/503 |
| 2013/0135017 | A1 | 5/2013 | Jones et al. | |

FOREIGN PATENT DOCUMENTS

EP      2104267 A1     9/2009

* cited by examiner

*Primary Examiner* — Don Le (57) ABSTRACT

Systems and methods are provided for transferring a signal from a first clock domain to a second clock domain. A system includes a pulse generator configured to receive an input data signal in the first clock domain and to generate a pulse. The system further includes an unclocked flip-flop configured to generate a first output signal. The first output signal is received by a circuit operating in the second clock domain, and the first output signal has one of a first logical value and a second logical value. The unclocked flip-flop is configured to set the first output signal to the first logical value in response to the pulse. The unclocked flip-flop is configured to reset the first output signal to the second logical value in response to a clock signal in the second clock domain and a second output signal generated by the circuit.

21 Claims, 6 Drawing Sheets

SYSTEMS AND METHODS FOR TRANSFERRING A SIGNAL FROM A FIRST CLOCK DOMAIN TO A SECOND CLOCK DOMAIN

CROSS-REFERENCE TO RELATED APPLICATIONS

The present application claims priority from U.S. Provisional Application Ser. No. 61/717,918, entitled "Fast Synchronizer," filed 24 Oct. 2012, the entirety of which is hereby incorporated by reference.

FIELD

This disclosure is related generally to the field of digital circuit design and more particularly to systems and methods for transferring a signal from a first clock domain to a second clock domain.

BACKGROUND

In various processing architectures, data signals are transferred between circuits operating in different clock domains. In order to ensure that data is properly sampled, the transferred data signals are synchronized to the clock of the receiving domain. Thus, an interface circuit that facilitates the transferring of data from one clock domain to another is known at times as a synchronizer. Without such synchronization, metastability problems produce invalid logic results, which cause digital systems to fail. Metastability arises when the signal input to a flip-flop in a particular clock domain does not meet the set-up or hold time requirements of the flip-flop. As a result, such an input signal places the flip-flop in a metastable state where an output of the flip-flop is momentarily somewhere between a logic level high value and a logic level low value. During the time that the flip-flop is in the metastable state, the flip-flop produces unpredictable logic results that cause system failure. Accordingly, the synchronizer is used to avoid metastability problems in the transferring of data signals between circuits operating in different clock domains.

The description above is presented as a general overview of related art in this field and should not be construed as an admission that any of the information it contains constitutes prior art against the present patent application.

SUMMARY

Systems and methods are provided for transferring a signal from a first clock domain to a second clock domain. A system for transferring a signal from a first clock domain to a second clock domain includes a pulse generator configured to receive an input data signal in the first clock domain and to generate a pulse corresponding to an edge of the input data signal. The system further includes an unclocked flip-flop configured to generate a first output signal corresponding to the edge of the input data signal. The first output signal is received by a circuit operating in the second clock domain, and the first output signal has one of a first logical value and a second logical value. The unclocked flip-flop is configured to set the first output signal to the first logical value in response to the pulse. The unclocked flip-flop is configured to reset the first output signal to the second logical value in response to a logical combination of i) a clock signal in the second clock domain, and ii) a second output signal generated by the circuit operating in the second clock domain.

As another example, a system for transferring a signal from a first clock domain to a second clock domain includes a pulse generator configured to receive an input data signal in the first clock domain and to generate a pulse corresponding to an edge of the input data signal. The system also includes an unclocked flip-flop configured to generate a first output signal corresponding to the edge of the input data signal. The first output signal has one of a first logical value and a second logical value. The system further includes a circuit operating in the second clock domain that is configured to receive the first output signal and to generate a second output signal representing the input data signal synchronized to a clock signal in the second clock domain. The second output signal is generated based on the first output signal. The unclocked flip-flop is configured to set the first output signal to the first logical value in response to the pulse. The unclocked flip-flop is configured to reset the first output signal to the second logical value in response to a feedback signal. The feedback signal indicates whether the first output signal has been sampled in the second clock domain.

As another example, in a method for transferring a signal from a first clock domain to a second clock domain, an input data signal is received in the first clock domain. A pulse corresponding to an edge of the input data signal is generated. A first output signal corresponding to the edge of the input data signal is generated. The first output signal is set at a first logical value in response to the pulse. A second output signal is generated by sampling the first output signal according to a clock signal in the second clock domain. The first output signal is reset to a second logical value based on a feedback signal. The feedback signal indicates that the first output signal has been sampled in the second clock domain. A third output signal is generated by sampling the second output signal according to the clock signal in the second clock domain. An edge in the third output signal lags behind an edge in the second output signal by approximately one period of the clock signal. The third output signal represents the input data signal synchronized to the clock signal in the second clock domain.

DETAILED DESCRIPTION

Figure 1A:
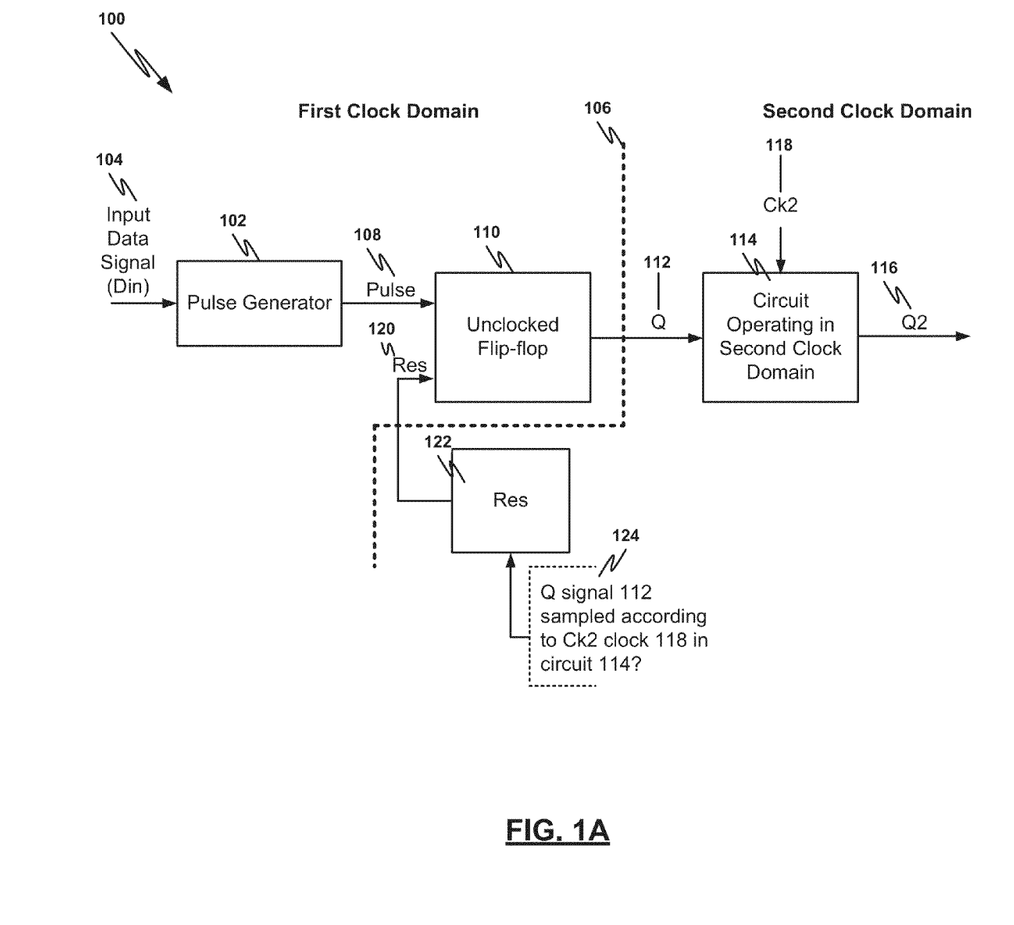
FIG. 1A is a block diagram depicting an example synchronizer including a pulse generator, configured as a rising edge cutter pulse generator in an embodiment, and an unclocked flip-flop used in passing an input data signal from a first clock domain to a second clock domain in one embodiment of the disclosure.

FIG. 1A is a block diagram depicting an example synchronizer 100 including a pulse generator 102 and unclocked flip-flop 110 used in passing an input data signal 104 from a first clock domain to a second clock domain in one embodiment of the disclosure. In various processing architectures, data signals are passed between circuits operating in different clock domains. For example, in an embodiment, a media access control (MAC) layer in a transceiver receives a signal from a transmitter at 156 MHz, but a processor in the transceiver operates at 600 MHz. In order to process the signal from the 156 MHz clock domain in the 600 MHz clock domain, the signal must be synchronized to the 600 MHz clock. In FIG. 1A, the input data signal 104 is being passed between circuitry operating in the first clock domain and circuitry operating in the second clock domain, where a dashed line 106 separates the circuitry operating in each of the first and the second clock domains. In an embodiment, the input data signal 104 is synchronized with a clock signal of the first clock domain. Thus, the input data signal 104 includes rising or falling edges that are aligned with edges of the clock signal of the first clock domain.

In order to ensure that the input data signal 104 is properly sampled in the second clock domain, the input data signal 104 is processed by the synchronizer 100. The synchronizer 100 includes a pulse generator 102, configured as a rising edge cutter pulse generator in an embodiment, that is configured to receive the input data signal 104. In an embodiment, the pulse generator 102 generates a pulse 108 corresponding to an edge of the input data signal 104, for example a rising edge in an embodiment. For example, in an embodiment, the pulse generator 102 generates the pulse 108 for each rising edge included in the input data signal 104. The pulse 108 has a relatively short width, and in an embodiment, the pulse 108 has a width that is less than half of one period of a clock signal in the first clock domain.

The example synchronizer 100 further includes the unclocked flip-flop 110 that receives the pulse 108 from the pulse generator 102. The unclocked flip-flop 110 is, in an embodiment, a set-reset (SR) flip-flop that is configured to generate a first output signal Q 112 corresponding to an edge of the input data signal 104. For example, in an embodiment, the unclocked flip-flop 110 is configured to set the first output signal Q 112 to a logic level high value ("1") for a period of time following each rising edge included in the input data signal 104. In an embodiment, the unclocked flip-flop 110 sets the first output signal Q 112 to the logic level high value based on the pulse 108 that is received at a "set" input of the unclocked flip-flop 110.

Figure 1B:
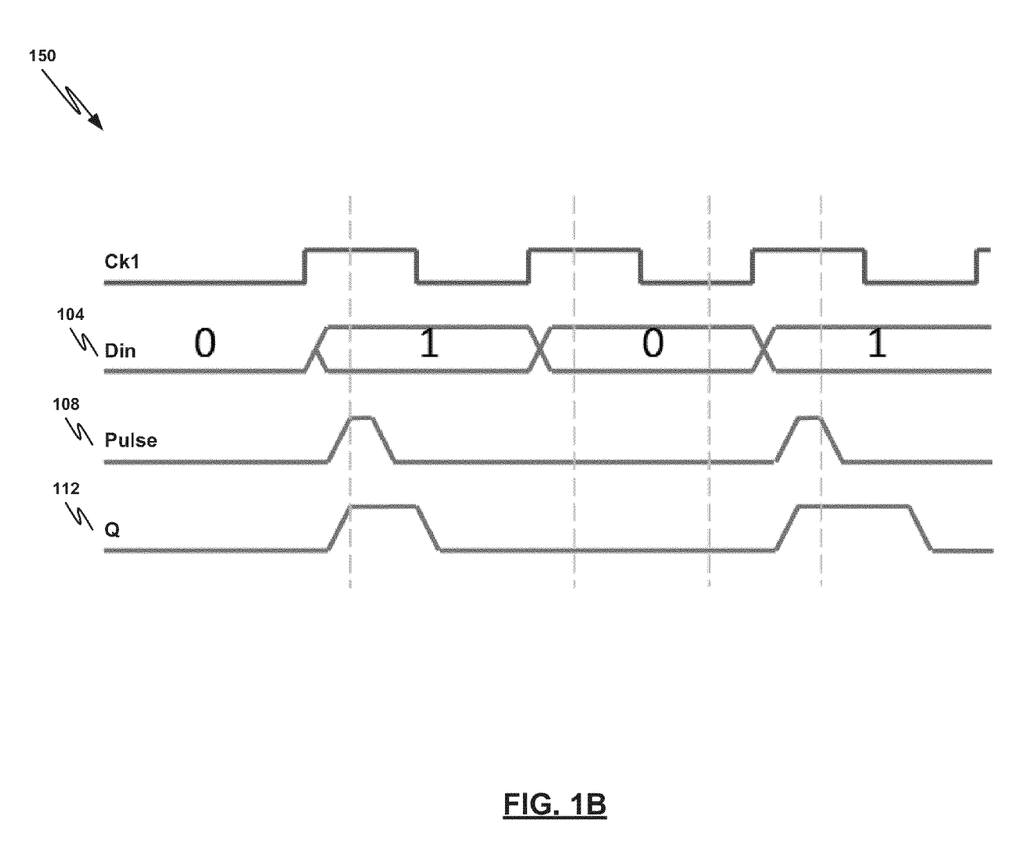
FIG. 1B depicts an example signal timing diagram illustrating signals generated by a pulse generator and an unclocked flip-flop, where the signals are generated in response to an input data signal in a first clock domain.

To illustrate the signals generated by the pulse generator 102 and the unclocked flip-flop 110, FIG. 1B depicts an example signal timing diagram 150. As depicted in FIG. 1B, in an embodiment, the input data signal 104 is synchronized with a clock signal ("Ck1") in the first clock domain, such that the input data signal 104 includes rising or falling edges that are aligned with edges of the Ck1 clock signal. As is further depicted in FIG. 1B, in an embodiment, the pulse signal 108 and the first output signal Q 112, generated by the pulse generator 102 and the unclocked flip-flop 110, respectively, are signals that respond to rising edges of the input data signal 104. Thus, in an embodiment, for each rising edge in the input data signal 104, the pulse generator 102 generates the pulse 108 having a short width. In response to its receipt of the pulse 108, the unclocked flip-flop 110 sets the first output signal Q 112 to a logic level high value for a period of time. As explained in further detail below, in an embodiment, the unclocked flip-flop 110 is configured to reset the first output signal Q 112 to a logic level low value ("0") in response to its receipt of a feedback signal 120.

In an embodiment, the unclocked flip-flop 110 is a pulse-driven flip-flop including a "set" input and a "reset" input and is configured to receive the pulse 108 on the set input and a pulse of the feedback signal 120 on the reset input. The pulses received on the set and reset inputs of the unclocked flip-flop 110 cause the first output signal Q 112 to be sampled in the second clock domain and then reset to the logic level low value immediately after the sampling, thus allowing the unclocked flip-flop 110 to be ready for a next rising edge on the input data signal 104. As described above, in an embodiment, the input data signal 104 is synchronized with the clock signal of the first clock domain and thus includes rising or falling edges that are aligned with edges of the clock signal of the first clock domain. Thus, in an embodiment, the flip-flop 110 need not include a clock input because the clock signal of the first clock domain is effectively represented by edges of the input data signal 104.

Referring again to FIG. 1A, the pulse generator 102 and the unclocked flip-flop 110 are used to effectively separate the input data signal 104 from remaining portions of the circuit that are used to synchronize the input data signal 104 to the second clock domain. Thus, after the generating of the pulse 108 and the assertion of the first output signal Q 112, the synchronizer 100 thereafter does not use the input data signal 104 in passing the input data signal 104 from the first clock domain to the second clock domain. Rather, in further processing, the synchronizer 100 uses the pulse 108 and the first output signal Q 112 to represent the input data signal 104. The synchronizer 100 effectively trades the input data signal 104 for the pulse 108 and the first output signal Q 112 in an embodiment of the disclosure. In an embodiment, the input data signal 104 is sampled in the second clock domain based only on the rising edges of the input data signal 104, and other portions of the input data signal 104 are extraneous for purposes of the sampling. The trading of the input data signal 104 for the pulse 108 and the first output signal Q 112 allows the synchronizer 100 to pass the first input signal 104 to the second clock domain based on the rising edges of the input data signal 104, without consideration of the extraneous other portions of the input data signal 104.

The first output signal Q 112 is received by a circuit 114 operating in the second clock domain. In an embodiment, the circuit 114 generates a second output signal Q2 116 that represents the input data signal 104 synchronized to a clock signal ("Ck2") 118 of the second clock domain. The second output signal Q2 116 is generated based on the received first output signal Q 112. In an embodiment, the circuit 114 directly receives the clock signal Ck2 118 of the second clock domain, and the received clock signal Ck2 118 is used by the circuit 114 in sampling the first output signal Q 112. For example, in an embodiment, the circuit 114 includes one or more clocked flip-flops that sample the first output signal Q 112 in response to edges of the clock signal Ck2 118, for example rising edges. The result of the sampling of the output signal Q 112 is output as the second output signal Q2 116 in an embodiment.

The unclocked flip-flop 110 receives a feedback signal ("Res") 120 that is configured to reset the first output signal Q 112. In an embodiment, the unclocked flip-flop 110 is a pulse-driven, set-reset (SR) flip-flop, such that a pulse included in the feedback signal Res 120 resets the first output signal Q 112 to a logic level low value. As illustrated in FIG. 1B, in an embodiment, the unclocked flip-flop 110 sets the first output signal Q 112 to a logic level high value for a period of time following each rising edge included in the input data signal 104, and the feedback signal Res 120 is used to reset the first output signal Q 112 to a logic level low value.

The feedback signal Res 120 is generated by a Res module 122. In an embodiment, the Res module 122 includes logic gates or other circuitry configured to receive signals from various components of the synchronizer 100. Based on the received signals, the Res module 122 produces the feedback signal Res 120. As described above, in an embodiment, a pulse included in the feedback signal Res 120 resets the first output signal Q 112 generated by the unclocked flip-flop 110. In an embodiment, the feedback signal Res 120 indicates whether the first output signal Q 112 has been sampled in the second clock domain by the circuit 114. Thus, as illustrated in FIG. 1A, in an embodiment, an output of the Res module 122 is based on a determination 124 of whether the first output signal Q 112 has been sampled in the circuit 114 according to the clock signal Ck2 118 of the second clock domain.

The unclocked flip-flop 110 is configured, in an embodiment, to react quickly to a rising edge of the input data signal 104 by setting the first output signal Q 112 to a logic level high value. The unlocked flip-flop 110 is further configured to reset the first output signal Q 112 to a logic level low value immediately after the signal Q 112 has been sampled in the second clock domain. By resetting the first output signal Q 112 to the logic level low value based on the feedback signal Res 120, the unclocked flip-flop 110 becomes ready to react to a subsequent edge of the input data signal 104. In an embodiment, the operation of the unclocked flip-flop 110 is timed such that the set-up and hold timing requirements of the flip-flop 110 are not violated, thus preventing the flip-flop 110 from entering into a metastable state. For example, in an embodiment, the synchronizer 100 is configured such that the pulse 108 and the feedback signal Res 120 are not asserted at a same point in time, thus preventing the unclocked flip-flop 110 from entering the metastable state.

Conventionally, when transferring an input data signal from a first clock domain to a second clock domain, the input data signal is passed through a plurality of D flip-flops to ensure that the data is output from the first domain in synchrony with the clock of the second clock domain. As frequencies increase, additional flip-flops are required to reduce the probability of the synchronizer entering into a metastable state. A conventional synchronizer requires, for example, three or more D flip-flops connected in series to reduce the probability of the synchronizer entering into the metastable state. The additional flip-flops require additional space and introduce additional delay in the propagation of the input data signal. Such additional space additional delay require a redesign of circuitry included in the first clock domain or the second clock domain in example embodiments.

In contrast to the conventional synchronizer described above, because the synchronizer 100 of FIG. 1A does not rely on a chain of D flip-flops, the aforementioned delay and latency problems inherent in the conventional synchronizer are eliminated. Rather, as described above, the synchronizer 100 is based on the unclocked flip-flop 110 being configured to receive a feedback signal as a reset signal, Res 120. As described above, the synchronizer 100 reacts quickly to a rising edge of the input data signal 104 by setting the first output signal Q 112 to a logic level high value and then resets the first output signal Q 112 to a logic level low value immediately after the signal Q 112 has been sampled in the second clock domain. By resetting the first output signal Q 112 to the logic level low value based on the feedback signal Res 120, the unclocked flip-flop 110 becomes ready to react to a subsequent edge of the input data signal 104.

The synchronizer 100 is designed to support any ratio of first clock domain and second clock domain frequencies and thus synchronizes the input data signal 104 from a higher frequency domain to a lower frequency domain, and vice versa. Further, in an embodiment, the synchronizer 100 is able to synchronize the input data signal 104 over a wide frequency range with low latency (e.g., less than 2 clock cycles). In an embodiment, the frequency range refers to a difference between a frequency of the clock signal of the first clock domain and a frequency of the clock signal of the second clock domain. For example, in an embodiment, the synchronizer 100 is configured to synchronize an input signal at 100 MHz with receiving domain circuitry operating at 1 GHz (i.e., synchronization over a frequency range of 900 MHz).

Figure 2A:
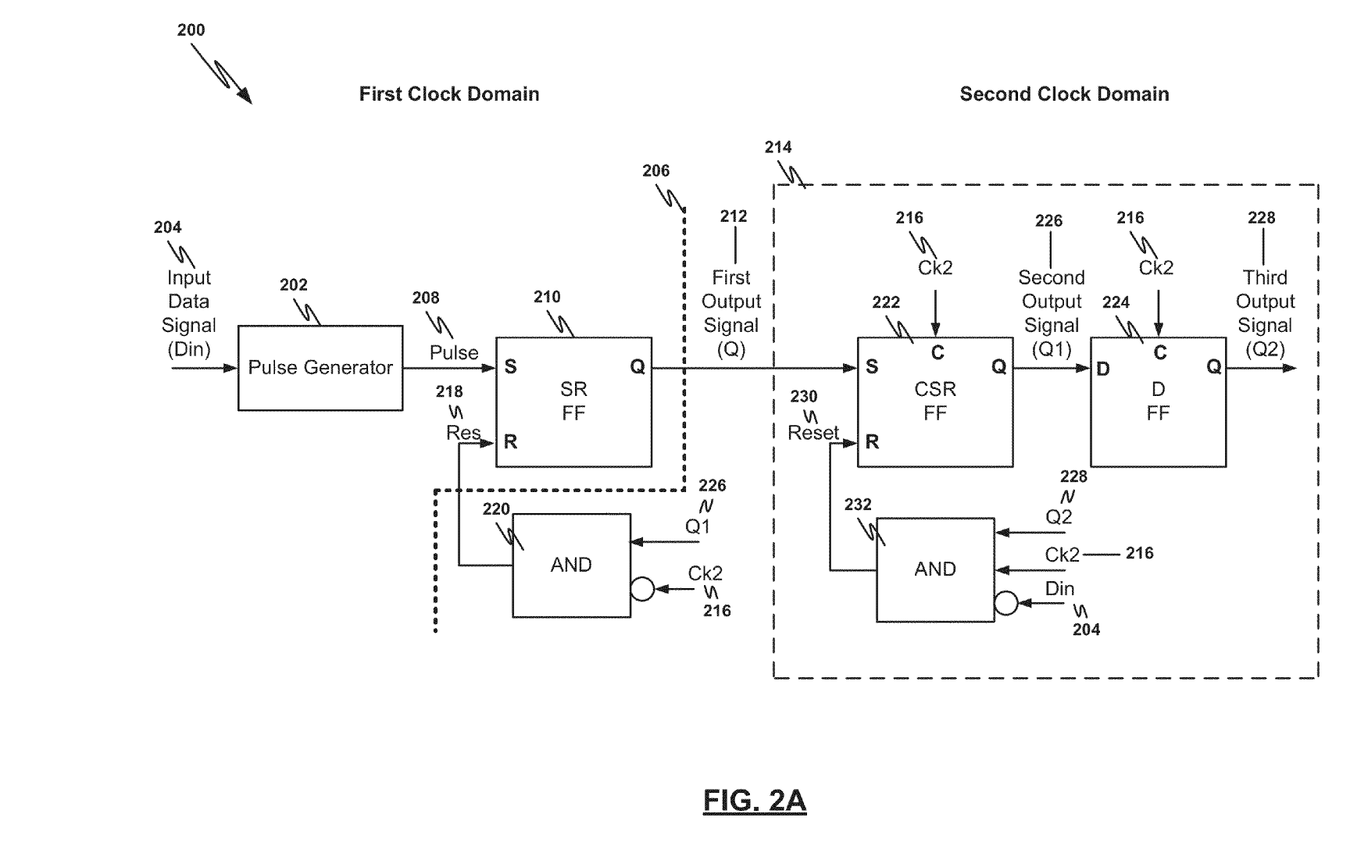
FIG. 2A is a block diagram depicting an example synchronizer for transferring an input data signal from a first clock domain to a second clock domain according to one embodiment of the disclosure.

FIG. 2A is a block diagram depicting an example synchronizer 200 for transferring an input data signal 204 from a first clock domain to a second clock domain according to one embodiment of the disclosure. In FIG. 2A, for example, the input data signal ("Din") 204 is being passed between circuitry operating in the first clock domain and circuitry operating in the second clock domain, where a dashed line 206 is a separation of the circuitry operating in each of the respective first and the second clock domains. In an embodiment, the input data signal Din 204 is synchronized with a clock signal of the first clock domain, such that the input data signal Din 204 includes rising or falling edges that are aligned with edges of a clock signal of the first clock domain.

In order to ensure that the input data signal Din 204 is properly sampled in the second clock domain, the input data signal Din 204 is synchronized to the clock of the second clock domain. To achieve this synchronization, the example synchronizer 200 of FIG. 2A includes a pulse generator 202 configured to receive the input data signal Din 204. In an embodiment, the pulse generator 202 generates a pulse 208 corresponding to an edge of the input data signal Din 204. For example, in an embodiment, the pulse generator 202 generates the pulse 208 for each rising edge included in the input data signal Din 204. The pulse 208 has a relatively short width, and in an embodiment, the pulse 208 has a width that is less than one period of a clock signal in the first clock domain.

The example synchronizer 200 further includes a set-reset (SR) flip-flop 210 that receives the pulse 208 from the pulse generator 202. The SR flip-flop 210 is an unclocked flip-flop that is configured to generate a first output signal Q 212 corresponding to an edge of the input data signal Din 204, such as a rising edge in an embodiment. For example, in an embodiment, the SR flip-flop 210 is configured to set the first output signal Q 212 to a logic level high value for a period of time following each rising edge included in the input data signal Din 204. The SR flip-flop 210 is a pulse-driven flip-flop, and thus, the logic level high values asserted in the first output signal Q 212 are a result of the received pulse signal 208 from the pulse generator 202. The first output signal Q 212 is a digital signal configured to have one of a first logical value and a second logical value (e.g., the first output signal Q 212 takes on logic level high and low values).

Figure 2B:
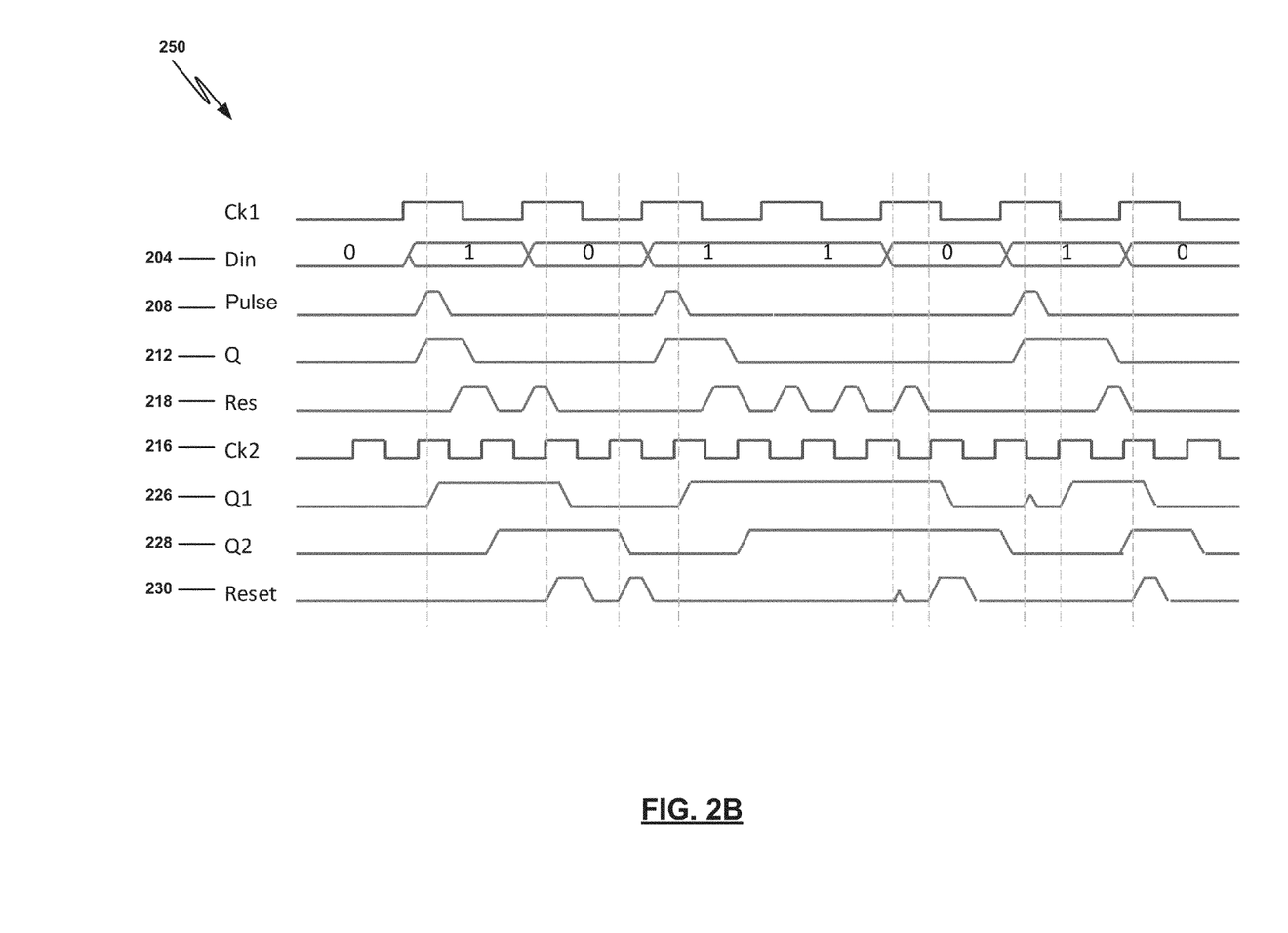
FIG. 2B is a signal timing diagram depicting example signals generated by a synchronizer in one embodiment of the disclosure.

To illustrate the signals generated by the pulse generator 202 and the SR flip-flop 210, FIG. 2B depicts an example signal timing diagram 250. As depicted in FIG. 2B, in an embodiment, the input data signal Din 204 is synchronized with a clock signal ("Ck1") in the first clock domain, such that the input data signal Din 204 includes rising or falling edges that are aligned with edges of the Ck1 clock signal. As is further depicted in FIG. 2B, in an embodiment, the pulse signal 208 and the first output signal Q 212, generated by the pulse generator 202 and the SR flip-flop 210, respectively, are signals that respond to rising edges of the input data signal Din 204. Thus, in an embodiment, for each rising edge in the input data signal Din 204, the pulse generator 202 generates a pulse on line 208. In response to its receipt of the pulse 208, the SR flip-flop 210 sets the first output signal Q 212 to a logic level high value for a period of time. As explained in further detail below, in an embodiment, the SR flip-flop 210 is configured to reset the first output signal Q 212 to a logic level low value in response to a logical combination of i) a clock signal ("Ck2") 216 in the second clock domain, and ii) a second output signal ("Q1") 226 generated by a circuit 214 operating in the second clock domain.

Referring again to FIG. 2A, the first output signal Q 212 is received by a circuit 214 operating in the second clock domain. In an embodiment, the circuit 214 operating in the second clock domain includes a clocked set-reset (CSR) flip-flop 222 and a D flip-flop 224 connected in a series arrangement. The CSR flip-flop 222 receives the first output signal Q 212 on a "set" input and receives a clock signal ("Ck2") 216 of the second clock domain on a "clock" input. The CSR flip-flop 222 is a clocked, level-driven flip-flop that also includes a "reset" input. In response to rising edges of the clock signal Ck2 216, the CSR flip-flop 222 looks at levels on the set and reset inputs.

In an embodiment, when the clock signal Ck2 216 goes high (i.e., a rising edge occurs), the CSR flip-flop 222 samples the first output signal Q 212 to generate a second output signal Q1 226. Thus, the second output signal Q1 226 has a logic level high value when the clock signal Ck2 216 goes high and the first output signal Q 212 is also high. This is illustrated in FIG. 2B, where in response to each rising edge of the clock signal Ck2 216, the CSR flip-flop 222 sets the second output signal Q1 226 to the value of the first output signal Q 212 for a period of time. As explained in further detail below, in an embodiment, the CSR flip-flop 222 is configured to reset the second output signal Q1 226 to a logic level low value in response to a feedback signal. In an embodiment, the feedback signal represents a logical combination of i) the clock signal Ck2 216 of the second clock domain, ii) a third output signal Q2 228 generated by the D flip-flop 224, and iii) the input data signal Din 204.

With reference again to FIG. 2A, as explained above, the CSR flip-flop 222 is connected in series with the D flip-flop 224. The D flip-flop 224 receives the second output signal Q1 226 that is generated by the CSR flip-flop 222. Based on the received second output signal Q1 226, the D flip-flop 224 generates a third output signal Q2 228 that represents the input data signal Din 204 synchronized with the clock signal Ck2 216 of the second clock domain. The D flip-flop 224 generates the third output signal Q2 228 by sampling the second output signal Q1 226 on rising edges of the clock signal Ck2 216. This is illustrated in FIG. 2B, where the third output signal Q2 228 is shown to take on the value of the second output signal Q1 226 at rising edges of the clock signal Ck2 216.

As described above, in an embodiment, the CSR flip-flop 222 generates the second output signal Q1 226 by sampling the first output signal Q 212 on rising edges of the clock signal Ck2 216. The D flip-flop 224 samples the second output signal Q1 226 on rising edges of the clock signal Ck2 216, but because of the series arrangement between the flip-flops 222, 224, the third output signal Q2 228 lags behind the second output signal Q1 226 by one period of the clock signal Ck2 216. In an embodiment, the synchronizer 200 includes the three flip-flops 210, 222, 224 and does not include additional flip-flops. Thus, in contrast to conventional synchronizer circuits, the synchronizer 200 does not rely on a chain of D flip-flops to synchronize the input data signal Din 204 with the clock signal Ck2 216 of the second clock domain.

In an embodiment, the SR flip-flop 210 receives a feedback signal ("Res") 218 that is configured to reset the first output signal Q 212. As illustrated in FIG. 2A, the feedback signal Res 218 is received on a "reset" input of the SR flip-flop 210. The SR flip-flop 210 is a pulse-driven flip-flop, and thus, a pulse received on the reset input resets the first output signal Q 212 to a logic level low value. In an embodiment, the reset input of the SR flip-flop 210 has priority over the set input, such that a pulse on the reset input immediately resets the first output signal Q 210, regardless of a state of the set input. As illustrated in FIG. 2B, in an embodiment, the SR flip-flop 210 sets the first output signal Q 212 to a logic level high value for a period of time following each rising edge included in the input data signal Din 204, and the feedback signal Res 218 is used to reset the first output signal Q 212 to a logic level low value.

The feedback signal Res 218 is generated by an "AND" module 220. In an embodiment, the "AND" module 220 comprises an "AND" logic gate, and in other embodiments, the "AND" module 228 comprises other analog or digital circuitry configured to perform an "AND" operation. In an embodiment, the "AND" module 220 receives i) the clock signal Ck2 216 of the second clock domain on a first input, and ii) the second output signal Q1 226 on a second input. As illustrated in FIG. 2A, the first input over which the clock signal Ck2 216 is received is an inverting input. The output of the "AND" operation performed by the "AND" module 220 is the feedback signal Res 218 that is received at the reset input of the SR flip-flop 210. Thus, the SR flip-flop 210 is configured to reset the first output signal Q 212 to the logic level low value in response to the logical combination of i) the clock signal Ck2 216 being at low level in the second clock domain, and ii) the second output signal Q1 226, where, in an embodiment, the logical combination is an "AND" operation.

In an embodiment, the feedback signal Res 218 indicates whether the first output signal Q 212 has been sampled in the second clock domain by the CSR flip-flop 222. The SR flip-flop 210 is configured to react quickly to edges of the input data signal Din 204 by setting the first output signal Q 212 to the logic level high value. The SR flip-flop 210 is further configured to reset the first output signal Q 212 to the logic level low value immediately after the signal Q 212 has been sampled by the CSR flip-flop 222. In an embodiment, the operation of the SR flip-flop 210 is timed such that the set-up and hold timing requirements of the SR flip-flop 210 are not violated, thus preventing the SR flip-flop 210 from entering into a metastable state. For example, in an embodiment, the synchronizer 200 is configured such that the pulse 208 and the feedback signal Res 218 are not asserted at the SR flip-flop 210 simultaneously, thus preventing the SR flip-flop 210 from entering the metastable state.

In an embodiment, the CSR flip-flop 222 receives a second feedback signal ("Reset") 230 that is configured to reset the second output signal Q1 226. As illustrated in FIG. 2A, the second feedback signal Reset 230 is received on a "reset" input of the CSR flip-flop 222. When the clock signal Ck2 216 is high, the CSR flip-flop 222 looks at the levels on its set and reset inputs. In an embodiment, the reset input of the CSR flip-flop 222 has priority over the set input. In such an embodiment, when the clock signal Ck2 216 is high and a logic level high value is received on the reset input (i.e., the second feedback signal Reset 230 is high), the second output value Q1 226 is reset to a logic level low value, regardless of the level on the set input.

The second feedback signal Reset 230 is generated by a second "AND" module 232. In an embodiment, the second "AND" module 232 comprises an "AND" logic gate or another digital or analog circuit configured to perform an "AND" operation. In an embodiment, the second "AND" module 232 receives i) the clock signal Ck2 216 of the second clock domain on a first input, ii) the third output signal Q2 228 on a second input, and iii) the input data signal Din 204 on a third input. As illustrated in FIG. 2A, the third input over which the input data signal Din 204 is received is an inverting input (i.e., Din is at 0). The output of the "AND" operation performed by the second "AND" module 232 is the second feedback signal Reset 230 that is received at the reset input of the CSR flip-flop 222. In an embodiment, the second output signal Q 226 is reset when i) the third output signal Q2 228 is asserted, ii) the clock signal Ck2 216 is asserted, and iii) the input data signal Din 204 is de-asserted, with the three conditions occurring simultaneously at the second "AND" module 232.

In an example embodiment, operation of the synchronizer 200 begins with each of the first output signal Q 212, the second output signal Q1 226, and the third output signal Q2 228 at logic level low states. The logic level low states of the signals 212, 226, 228 are, in an embodiment, the result of a power-up and reset of the synchronizer 200. Once the input data signal Din 204 changes from a logic level low to a logic level high state, the pulse generator 202 generates the short pulse 208 that is received by the SR flip-flop 210. In response to the receipt of the pulse 208, the SR flip-flop 210 causes the first output signal Q 212 to have the logic level high value.

In the example embodiment, operation of the synchronizer 200 continues based on the first output signal Q 212. As a result of the first output signal Q 212 having the logic level high value, when the clock signal Ck2 216 is high, the CSR flip-flop 222 causes the second output signal Q1 226 to have the logic level high. In other words, the CSR flip-flop 222 samples the first output signal Q 212 when the clock signal Ck2 216 is high. In the example embodiment, the synchronizing of the input data signal Din 204 includes a sequential operation, where i) the edge of the input data signal 204 causes the pulse 208 to be generated, ii) the pulse 208 causes the first output signal Q 212 to be asserted, and iii) the first output signal Q 212 causes the second output signal Q1 226 to be asserted. The sequential operation helps to ensure that the SR flip-flop 210 does not enter into a metastable state. For example, because the feedback signal Res 218 is not asserted until the second output signal Q1 226 has a logic level high value, and because the second output signal Q1 226 does not have the logic level high value until after the pulse 208 is asserted, the SR flip-flop 210 necessarily does not receive logic level high values on both of its set and reset inputs at the same time. Because the pulse 208 and the feedback signal Res 220 are not asserted at the SR flip-flop 210 at the same time, the SR flip-flop 210 does not enter a metastable state.

In the example embodiment, operation of the synchronizer 200 continues based on the clock signal Ck2 216. When the clock signal Ck2 216 changes to zero, the SR flip-flop 210 is reset by the "AND" module 220, and the first output signal Q 212 takes on a logic level low value where Q 212 is equal to "0." When the clock signal Ck2 216 changes to a logic level high value the following cycle, the D flip-flop 224 samples the second output signal Q1 226 and causes the third output signal Q2 228 to have a logic level high value where Q2 228 is equal to "1." Continuing with the operation of the synchronizer 200, when the input data signal Din 204 has changed from high to low and the clock signal Ck2 216 changes to a logic level high value at the next cycle of the clock Ck2 216, the CSR flip-flop 222 is reset by the second "AND" module 232. The second output signal Q1 226 is reset to a logic level low value. This completes synchronization of the first pulse of the input data signal Din 204 to the second clock domain.

In an embodiment, a glitch filter is optionally used to filter out very fast glitches, where the glitch filter is added on the first output signal Q 212. The glitch filter includes, in an embodiment, a resistor-capacitor (RC) circuit. It is noted that although the example synchronizer 200 of FIG. 2A is described in terms of the signal timing diagram 250 of FIG. 2B, various of the signals described herein are inverted or otherwise modified in example embodiments, without modification to the operation of the synchronizer 200. For example, in an embodiment, following an edge of the input data signal Din 204, the first output signal Q 212 has a logic level low value for a period of time before being reset to a logic level high value. This is in contrast to the first output signal Q 212 as described above, which has a logic level high value for the period of time following the edge of the input data signal Din 204. In a similar manner, in other embodiments, other ones of the signals 204, 208, 216, 218, 226, 228, 230 are inverted or otherwise modified slightly from the description provided herein without affecting operation of the synchronizer 200.

Figure 2C:
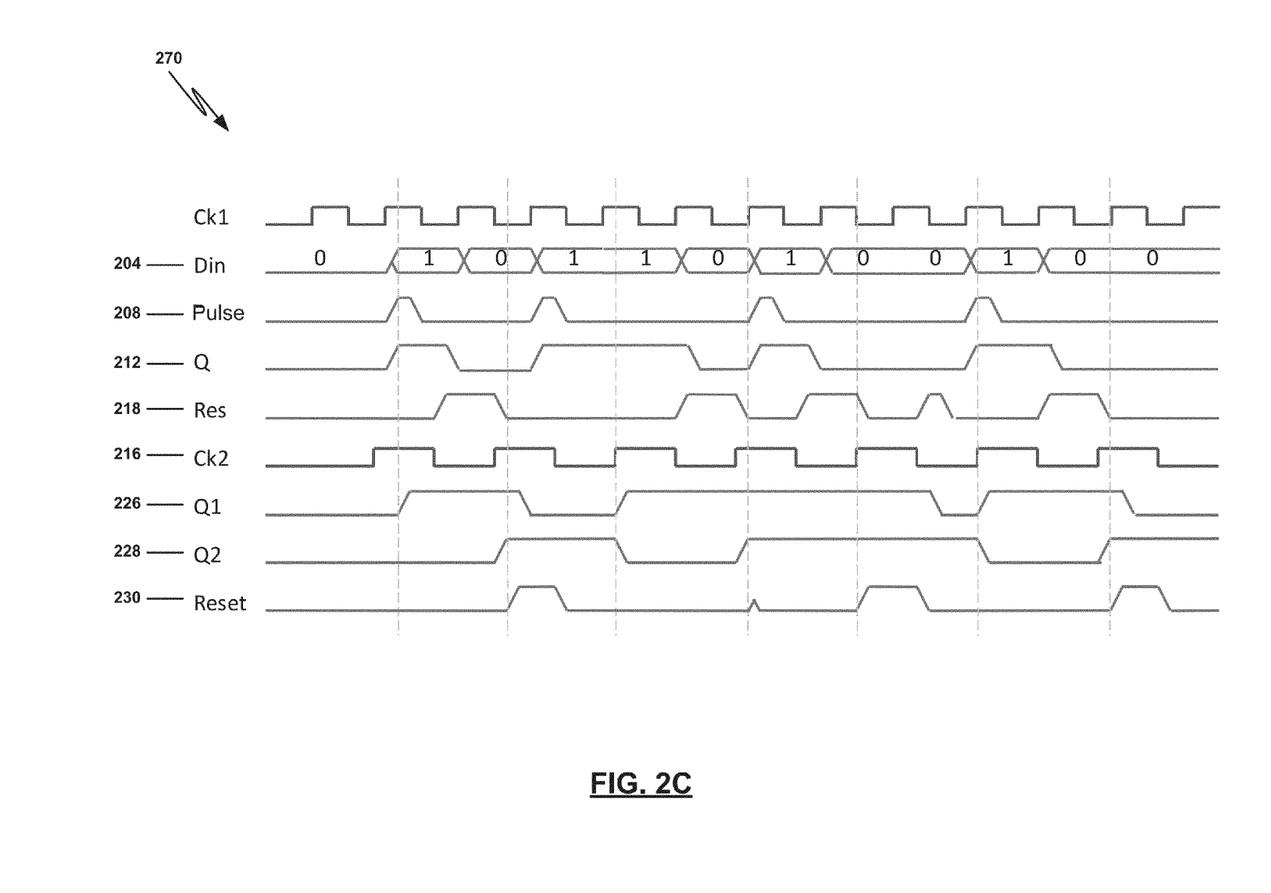
FIG. 2C is a signal timing diagram depicting example signals generated by a synchronizer in one embodiment of the disclosure, where the synchronizer is used to synchronize input signals from a higher frequency clock domain to a lower frequency clock domain.

The synchronizer 200 of FIG. 2A is configured to synchronize signals over a wide range of frequencies with low latency. In an embodiment, the input data signal Din 204 is synchronized from a low frequency clock domain to a high frequency clock domain, and vice versa. For example, although FIG. 2B illustrates a synchronization from a low frequency domain (e.g., the slower Ck1 clock domain) to a high frequency domain (e.g., the faster Ck2 clock domain), the synchronizer 200 of FIG. 2A is also used to synchronize the input data signal Din 204 from a high frequency clock domain to a low frequency clock domain. Signals used in such a synchronization are illustrated in the example signal timing diagram 270 of FIG. 2C.

When synchronizing the input data signal Din 204 from the low frequency clock domain to the high frequency clock domain, in an embodiment, the pulse generator 202, the SR flip-flop 210, and the "AND" module 220 are not included in the synchronizer 200. In this embodiment, the input data signal Din 204 is sampled directly by the CSR flip-flop 222. In another embodiment, when synchronizing the input data signal Din 204 from the low frequency clock domain to the high frequency clock domain, the pulse generator 202, SR flip-flop 210, and "AND" module 220 components are inactive in the synchronizer 200 or are bypassed such that they have no effect on the synchronization.

In an embodiment, the synchronizer 200 of FIG. 2A is configured such that the flip-flops 210, 222 do not enter a metastable state or are operated in the metastable state for only a short period of time. This is achieved by operating the flip-flops 210, 222 such that there is no violation of the set-up and hold time requirements of the flip-flops 210, 222, or by ensuring that if the metastable state is entered, the flip-flops 210, 222 are quickly forced to exit the metastable state. As described above, the design and operation of the synchronizer 200 prevents the SR flip-flop 210 from entering into a metastable state. For example, in an embodiment, the synchronizer 200 is configured such that the pulse 208 and the feedback signal Res 218 are not asserted at a same point in time, thus preventing the SR flip-flop 210 from entering a metastable state.

The CSR flip-flop 222 is able to enter into a metastable state, in an embodiment. For example, when the first output signal Q 212 received on the "set" input of the CSR flip-flop 222 is violating a set-up timing requirement of the CSR flip-flop 222, the CSR flip-flop 222 enters into the metastable state. In an embodiment, the set-up timing requirement is violated if the first output signal Q 212 is rising at a same time as the clock signal 216 is falling. In such instances where the CSR flip-flop 222 enters into the metastable state, the CSR flip-flop 222 is forced to receive an input on the "set" input or the "reset" input on the next rising edge of the clock signal Ck2 216. The "set" or "reset" input received forces the CSR flip-flop 222 to exit the metastable state. Thus, a maximum amount of time the CSR flip-flop 222 remains in the metastable state is equal to one half of a period of the clock signal Ck2 216. Additionally, all logic gates in the synchronizer 200 are configured to have fast rise and fall times that reduce the probability of the flip-flops 210, 222 entering the metastable state. Thus, the rise and fall times of the pulse 208, the first output signal Q 212, the second output signal Q1 226, the feedback signal Res 218, the second feedback signal Reset 230, and the clock signal Ck2 216 are relatively fast, thus reducing the probability of the flip-flops 210, 222 entering a metastable state.

In an embodiment, a bit error rate (BER) measures a probability of the flip-flops 210, 222 entering into a metastable state, and certain architectures using the synchronizer 200 require that the BER is less than $1^{-2}$. In an embodiment, the BER is inversely related to the latch gain (A) of the flip-flop, and the following equation illustrates that BER is an exponential function of the ratio between Tr (regeneration time) and Tau (time constant) of the flip-flop:

$$BER = \frac{1}{A} \propto \mathrm{Exp}\left(-\frac{Tr}{Tau}\right). \quad \text{(Equation 1)}$$

Therefore, the BER is reduced by increasing the latch gain (A) of the flip-flop or by reducing the latch time constant (Tau) of the flip-flop. In the synchronizer 200 of FIG. 2A, a minimum value of Tr for synchronization of one cycle is equal to approximately one period of the clock signal Ck2 216 (e.g., 840 ps, in an embodiment) and Tau is equal to 26 ps in an example worst case. Based on the minimum value of Tr equal to 840 ps and the worst-case Tau equal to 26 ps, the BER is equal to approximately $9.3E^{-15}$ in an embodiment. Such a result illustrates that the synchronizer 200 of FIG. 2A meets the BER requirements of the certain architectures.

Figure 3:
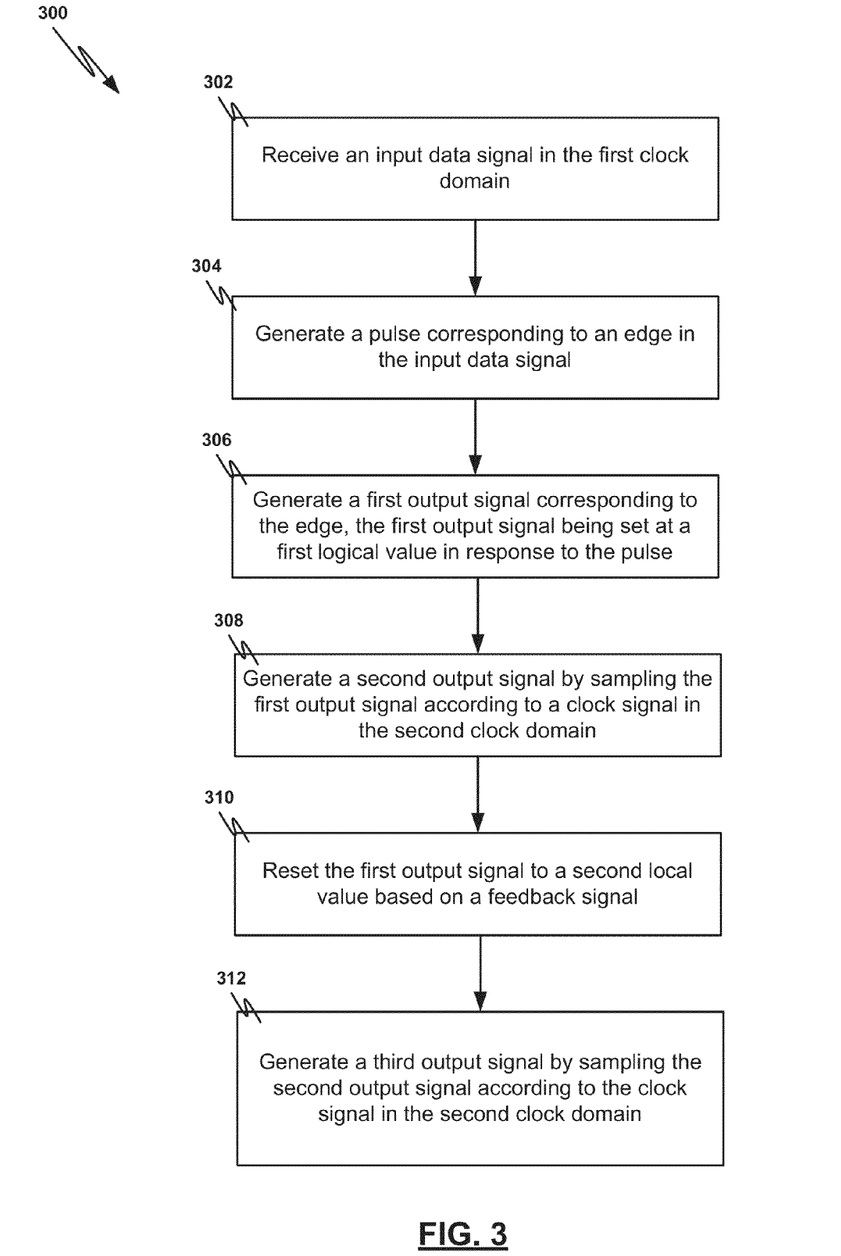
FIG. 3 is a flow diagram depicting an example method for transferring a signal from a first clock domain to a second clock domain according to one embodiment of the disclosure.

FIG. 3 is a flow diagram 300 depicting an example method for transferring a signal from a first clock domain to a second clock domain according to one embodiment of the disclosure. At 302, an input data signal in the first clock domain is received. At 304, a pulse is generated corresponding to an edge, for example a rising edge, of the input data signal. At 306, a first output signal corresponding to the edge of the input data signal is generated, where the first output signal is set at a first logical value in response to the pulse. At 308, a second output signal is generated by sampling the first output signal according to a clock signal in the second clock domain. At 310, the first output signal is reset to a second logical value based on a feedback signal. The feedback signal indicates that the first output signal has been sampled in the second clock domain. At 312, a third output signal is generated by sampling the second output signal according to the clock signal in the second clock domain. An edge in the third output signal lags behind an edge in the second output signal by approximately one period of the clock signal. The third output signal is also used as feedback to reset the second output signal, preparing it for a next synchronization operation. The third output signal represents the input data signal synchronized to the clock signal in the second clock domain.

This written description depicts examples so as to enable a person skilled in the art to make and use the claimed inventions. The patentable scope includes other examples. Additionally, in various embodiments, the methods and systems described herein are implemented on many different types of processing devices by program code comprising program instructions that are executable by the device processing subsystem. The software program instructions include source code, object code, machine code, or any other stored data that is operable to cause a processing system to perform the methods and operations described herein. Other implementations are used in an embodiment, however, such as firmware or even appropriately designed hardware configured to carry out the methods and systems described herein.

This application uses examples to illustrate the invention. The patentable scope of the application is defined by the claims below and includes other examples that are not seen.

It is claimed:

1. A system for transferring a signal from a first clock domain to a second clock domain, the system comprising:
a pulse generator configured to receive an input data signal in the first clock domain and to generate a pulse corresponding to an edge of the input data signal; and
an unclocked flip-flop configured to generate a first output signal corresponding to the edge of the input data signal, the first output signal being received by a circuit operating in the second clock domain, and the first output signal having one of a first logical value and a second logical value,
wherein the unclocked flip-flop is configured to set the first output signal to the first logical value in response to the pulse, and
wherein the unclocked flip-flop is configured to reset the first output signal to the second logical value in response to a logical combination of i) a clock signal in the second clock domain, and ii) a second output signal generated by the circuit operating in the second clock domain.

2. The system of claim 1, wherein the logical combination of i) the clock signal in the second clock domain, and ii) the second output signal indicates whether the first output signal has been sampled in the second clock domain.

3. The system of claim 1, wherein the circuit operating in the second clock domain includes a first clocked flip-flop and a second clocked flip-flop connected in a series arrangement, the second clocked flip-flop being configured to receive the second output signal that is generated by the first clocked flip-flop, wherein the second clocked flip-flop is configured to generate a third output signal that represents the input data signal synchronized with the clock signal in the second clock domain.

4. The system of claim 3, wherein the system includes the unclocked flip-flop, the first clocked flip-flop, and the second clocked flip-flop, and wherein the system does not include additional flip-flops.

5. The system of claim 3, wherein the circuit operating in the second clock domain comprises:

the first clocked flip-flop configured to receive the first output signal and to generate the second output signal based on the first output signal,
wherein the first clocked flip-flop is configured to set the second output signal to the first logical value in response to i) the received first output signal having the first logical value, and ii) an edge of the clock signal in the second clock domain, and
wherein the first clocked flip-flop is configured to reset the second output signal to the second logical value in response to a second logical combination of i) the clock signal in the second clock domain, ii) the third output signal, and iii) the input data signal; and
the second clocked flip-flop configured to receive the second output signal and to generate the third output signal by sampling the second output signal.

6. The system of claim 5, wherein the circuit operating in the second clock domain further comprises:
an "AND" gate that receives i) the clock signal on a first input, ii) the third output signal on a second input, and iii) the input data signal on a third input, the third input being an inverting input, wherein an output of the "AND" gate is received at a reset input of the first clocked flip-flop and is configured to reset the second output signal to the second logical value when the output of the "AND" gate is equal to the first logical value.

7. The system of claim 5, wherein an edge of the third output signal lags behind an edge of the second output signal by one period of the clock signal in the second clock domain.

8. The system of claim 5, wherein the unclocked flip-flop is a set-reset (SR) flip-flop, wherein the first clocked flip-flop is a clocked set-reset (CSR) flip-flop, and wherein the second clocked flip-flop is a D flip-flop.

9. The system of claim 5, wherein an edge of the clock signal in the second clock domain is configured to force the first clocked flip-flop out of a metastable state.

10. The system of claim 1, further comprising:
an "AND" gate that receives i) the clock signal on a first input, and ii) the second output signal on a second input, the second input being an inverting input, wherein an output of the "AND" gate is received at a reset input of the unclocked flip-flop and is configured to reset the first output signal to the second logical value when the output of the "AND" gate is equal to the first logical value.

11. The system of claim 10,
wherein an edge of the pulse is received at a set input of the unclocked flip-flop at a first point in time,
wherein an edge of the output of the "AND" gate is received at the reset input of the unclocked flip-flop at a second point in time, and
wherein the first point in time is not equal to the second point in time to prevent the unclocked flip-flop from entering a metastable state.

12. The system of claim 1, wherein a clock signal in the first clock domain has a first period, and wherein a width of the pulse is less than the first period.

13. The system of claim 1,
wherein a clock signal in the first clock domain has a first frequency,
wherein the clock signal in the second clock domain has a second frequency, and
wherein the first frequency is greater than the second frequency.

14. A system for transferring a signal from a first clock domain to a second clock domain, the system comprising:
a pulse generator configured to receive an input data signal in the first clock domain and to generate a pulse corresponding to an edge of the input data signal;
an unclocked flip-flop configured to generate a first output signal corresponding to the edge of the input data signal, the first output signal having one of a first logical value and a second logical value; and
a circuit operating in the second clock domain that is configured to receive the first output signal and to generate a second output signal representing the input data signal synchronized to a clock signal in the second clock domain, the second output signal being generated based on the first output signal,
wherein the unclocked flip-flop is configured to set the first output signal to the first logical value in response to the pulse, and
wherein the unclocked flip-flop is configured to reset the first output signal to the second logical value in response to a feedback signal, the feedback signal indicating whether the first output signal has been sampled in the second clock domain.

15. The system of claim 14, wherein the circuit includes a first clocked flip-flop and a second clocked flip-flop connected in series, the first clocked flip-flop being configured to receive the first output signal from the unclocked flip-flop, and wherein the system does not include additional flip-flops.

16. The system of claim 14,
wherein a clock signal in the first clock domain has a first frequency,
wherein the clock signal in the second clock domain has a second frequency, and
wherein the first frequency is greater than the second frequency.

17. The system of claim 14, wherein the feedback signal is generated based on a logical combination of i) the clock signal in the second clock domain, and ii) an intermediate output signal generated by the circuit operating in the second clock domain, the intermediate output signal being different from the second output signal.

18. A method for transferring a signal from a first clock domain to a second clock domain, the method comprising:
receiving at a pulse generator an input data signal in the first clock domain;
generating at the pulse generator a pulse corresponding to an edge of the input data signal;
generating at an unclocked flip-flop a first output signal corresponding to the edge of the input data signal, the first output signal being set at a first logical value in response to the pulse;
generating a second output signal by sampling the first output signal at a flip-flop in the second domain according to a clock signal in the second clock domain; and
resetting at the unclocked flip-flop in the first clock domain the first output signal to a second logical value based on a feedback signal, the feedback signal indicating that the first output signal has been sampled in the second clock domain.

19. The method of claim 18, further comprising:
generating the first, second, and third output signals, wherein no additional flip-flops are utilized in the generating.

20. The method of claim 18, further comprising:
generating a clock signal in the first clock domain having a first frequency; and
generating the clock signal in the second clock domain having a second frequency, wherein the first frequency is greater than the second frequency.

21. The method of claim 18, further comprising:
generating a third output signal by sampling the second output signal according to the clock signal in the second clock domain, wherein an edge in the third output signal lags behind an edge in the second output signal by approximately one period of the clock signal, and wherein the third output signal represents the input data signal synchronized to the clock signal in the second clock domain.

* * * * *